United States Patent [19]

Suzuki et al.

[11] Patent Number: 5,234,522

[45] Date of Patent: Aug. 10, 1993

[54] METHOD OF PRODUCING FLEXIBLE PRINTED-CIRCUIT BOARD COVERED WITH COVERLAY

[75] Inventors: Masakatsu Suzuki; Junichi Imaizumi, both of Shimodate; Hiroshi Nomura, Oyama; Kouichi Nagao, Shimodate; Yasushi Katoh, Shimodate; Takato Oti, Shimodate; Eikichi Satou, Oyama, all of Japan

[73] Assignee: Hitachi Chemical Company, Inc., Tokyo, Japan

[21] Appl. No.: 800,586

[22] Filed: Nov. 27, 1991

[30] Foreign Application Priority Data

Dec. 5, 1990 [JP] Japan .................................. 2-400480

[51] Int. Cl.$^5$ .............................................. B32B 31/00
[52] U.S. Cl. ...................................... 156/249; 29/829; 156/239; 156/272.6; 156/278; 156/323; 156/331.1; 174/259; 428/202; 428/473.5
[58] Field of Search ............... 156/272.6, 239, 278, 156/249, 323, 331.1; 174/259; 428/473.5, 202; 29/829

[56] References Cited

U.S. PATENT DOCUMENTS 4,937,133  6/1990  Watanabe et al. ............... 428/473.5
5,089,346  2/1992  Imaizumi et al. ................ 156/331.1

FOREIGN PATENT DOCUMENTS 0389951  10/1990  European Pat. Off. .
1434935  3/1966  France .

*Primary Examiner*—John J. Gallagher
*Attorney, Agent, or Firm*—Frishauf, Holtz, Godman & Woodward

[57] ABSTRACT

A flexible printed-circuit board covered with a coverlay is produced by bonding (a) a flexible printed-circuit board that comprises a flexible base having a surface bearing a circuit and (b) a polyimide film having a surface treated to increase adhering property and another surface not treated to increase adhering property, each of the surfaces being coated with an adhesive layer, with the adhesive layer on the surface treated to increase adhering property interposed between the polyimide film and the surface bearing the circuit, and then peeling off the adhesive layer coating the polyimide film on the surface not treated to increase adhering property.

22 Claims, No Drawings

METHOD OF PRODUCING FLEXIBLE PRINTED-CIRCUIT BOARD COVERED WITH COVERLAY

BACKGROUND OF THE INVENTION (a) Field of the Invention

The present invention relates to a method of producing a flexible printed-circuit board covered with a coverlay film. The coverlay film is prevented effectively from curling and is used so that it and the flexible printed-circuit board can be located together easily. The applied coverlay is excellent in heat resistance, flexibility and dimensional stability.

(b) Description of the Related Art

Coverlay films are for protecting circuits made on flexible printed-circuit boards. Coverlay films are prepared by coating one surface of a base film, such as a polyimide film, with an adhesive, such as an acrylic adhesive or an epoxy adhesive, and are applied to a flexible printed-circuit board by bonding the surface coated with the adhesive to a surface of the flexible printed-circuit, board bearing a circuit using heat and pressure.

For the purpose of producing flexible printed-circuit boards of improved high efficiency, the use of conventional copper-clad laminates having a three-layer structure of copper foil/epoxy or acrylic adhesive/polyimide film has recently become replaced by the use of a two-layer structure of copper foil/polyimide film. However, using the above-described conventional coverlay films has ruined the advantages of copper-clad laminates of a two-layer structure, since, after covering with the coverlay, the properties of the flexible printed-circuit boards, including heat resistance, are dominated by the acrylic or epoxy adhesives used for bonding the coverlay films. In order to overcome such a problem, the use of polyimide adhesives was proposed as disclosed in Japanese Patent Application Kokai Koko (Laid-open) No. 3-205474.

However, the use of polyimide adhesives in preparation of coverlay films for flexible printed-circuit boards also encountered a problem that the coverlay films curled when dried after coating, thereby interfering with the proper location of them and flexible printed-circuit boards.

The causes for the problem inlcude the following (1) and (2).

(1) Polyimide adhesives contract severely when dried after application thereof on a base film, since polyimide for adhesives are generally poor in the solubility in solvents, as compared with acrylic or epoxy compounds for adhesives. Accordingly, a large amount of solvents is required for the preparation of polyimide adhesives, with the concentration of the polyimide adhesive components in the polyimide adhesives lowered.

(2) In production of two-layer flexible printed-circuit boards, for the purpose of preventing curling thereof, polyimides of low thermal expansion are generally used as base materials in order to make the circuit and the polyimide base similar in linear thermal expansion coefficient. While low thermal expansion is also required of the base films of coverlays, coverlay films themselves are apt to curl due to the difference in linear thermal expansion between the base film and adhesive layer thereof, since polyimides for adhesives do not have low thermal expansion.

SUMMARY OF THE INVENTION

An object of the present invention is to provide a method of producing a flexible printed-circuit board covered with a coverlay, wherein a polyimide adhesive is used as an adhesive of a coverlay film. The coverlay film being film excellent in heat resistance and is prevented effectively from curling.

As the result of the inventors' research for preventing coverlay films for flexible printed-circuit boards from the curling thereof due to the use of polyimide adhesives, they found that such curling of coverlay films could be prevented. This result was achieved by using the generally poor adherence between polyimide/polyimide and by coating both surfaces of a base film with an adhesive to form a sandwich, only one of the surfaces that is to be bonded to the conductor-circuit-bearing surface of a flexible printed-circuit board being treated to improve the adhering property prior to the application of the adhesive. The adhesive applied to the other surface that is not treated to improve the adhering property or is subjected to a release treatment prior to the application, is peeled off from the base film after the coverlay film is bonded to the flexible printed-circuit board by heating and pressing the sandwich.

That is, the present invention provides a method of producing a flexible printed-circuit board covered with a coverlay comprising: assembling (a) a flexible printed-circuit board that comprises a flexible base having a surface bearing a circuit; and (b) a polyimide film having a surface treated to increase the adhering property and another surface not treated to increase the adhering property, each of the surfaces being coated with an adhesive layer by applying a polyimide adhesive to each of the surfaces and drying the applied polyimide adhesive by heating, the polyimide adhesive comprising a compound selected from the group consisting of a polyimide and a polyimide precursor;

to form a composite wherein the adhesive layer coating the surface treated to increase the adhering property is interposed between the polyimide film and the surface bearing the circuit;

subjecting the composite to heat and pressure to bond the composite into a laminate structure; and peeling off the adhesive layer coating the polyimide film on the surface not treated to increase the adhering property from the laminate structure.

DESCRIPTION OF THE PREFERRED EMBODIMENT

In the present invention, from the viewpoint of high heat resistance, good flexibility and excellent dimensional stability, a polyimide film is used as a base film for a coverlay film. For the purpose of preventing the product flexible printed-circuit board covered with a coverlay from curling, it is preferable to use a polyimide film of low thermal expansion which has a similar linear thermal expansion coefficient to that of the circuit materials. Preferred polyimide films have a linear thermal expansion coefficient of not larger than $2.5 \times 10^{-5} \mathrm{deg}^{-1}$ at a temperature of 50° to 250° C. Typical examples of the preferred polyimide film include UPILEX-S (produced by Ube Industries, Ltd.), UPILEX-SGA (produced by Ube Industries, Ltd.), APIKAL-NPI (produced by Kanegafuchi Chemical Industry Co., Ltd.), and NOVAX (produced by Mitsubishi Chemical Industries Ltd.).

One surface of the polyimide film is treated to improve the adhering property. Some examples of the treatment for improving adhering property include a mechanical treatment, such as brushing and sandblasting, and a chemical treatment, such as an alkali treatment, a corona treatment and a plasma treatment. Plasma treatments are preferable because of their high efficiency in improving the adhering property.)

The plasma treatment may be carried out either continuously or batchwise. From the viewpoint of efficiency, a continuous process is desirable. Some examples of the gas to be used for the plasma treatment include oxygen, nitrogen, helium, argon or $CF_4$. These gases may be used individually or as a mixture of two or more kinds of gases. The pressure of the plasma treatment is preferably from 0.08 to 0.15 torr, and the plasma power density (throwing electric power/area of electrode) is preferably from 0.2 to 100 $W/cm^2$, more preferably from 0.5 to 50 $W/cm^2$. The period of the plasma treatment is preferably from 10 seconds to 30 minutes or more, and it depends on other conditions.

The surface opposite to the surface treated to improve adhering property is not treated to improve the adhering property or is subjected to a release treatment. The release treatment is generally performed by application of a release agent, such as a silicone release agent and a non-silicone release agent. Some typical examples of the non-silicone release agent include a polyethylene wax, a polyvinyl carbamate and a polyethylimine/alkyl glycidyl ether.

Both surfaces of the polyimide film treated as described above are coated with a polyimide adhesive, and the applied polyimide adhesive is dried to form two adhesive layers coating the surfaces of the polyimide film. In an embodiment, first a polyimide adhesive is applied to the surface that was not treated to improve the adhering property or was subjected to a release treatment, and is then dried to coat the surface with an adhesive layer. Subsequently, the same polyimide adhesive is applied to the surface opposite to the surface coated with the adhesive layer, namely the surface treated to improve the adhering property, and is then dried to form another adhesive layer coating the surface treated to improve the adhering property. The drying is conducted preferably by employing a full-float system so as to prevent contact between the applied polyimide adhesive and conveyer devices, etc. in a drying furnace. It is preferable to adjust the thickness of the applied polyimide adhesive so that, after drying, the adhesive layers are 1.0 to 1.5 times as thick as the circuit. If the thickness of the adhesive layers are smaller than that of the circuit, it will be difficult to bury the circuit completely in the adhesive layer during bonding by heating and pressing. If it is more than 1.5 times as thick as the circuit, reduction of residual volatile matter in the adhesive layers after drying will be difficult, and the cost will be increased.

It is preferably to reduce the quantity of the residual volatile matter remaining in the adhesive layers after drying to not more than 1.5% by weight of the adhesive layers, more preferably not more than 1% by weight. A large quantity of residual volatile matter is undesirable because it causes a void or peeling in the interface between the coverlay polyimide film and the flexible printed-circuit board at the time of bonding to the flexible printed-circuit board or solder-reflowing on the coverlaid flexible printed-circuit board.

The polyimide adhesive used in the present invention comprises a compound selected from the group consisting of a polyimide and a polyimide precursor, each of the group member being generally dissolved in a solvent. The preferred examples of the polyimide precursor include a polyamic acid and a bis-maleimide compound.

The preferred polyimide adhesive comprises a polyamic acid comprising a repeating unit represented by the following formula (1)

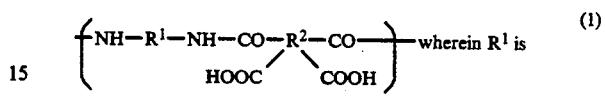

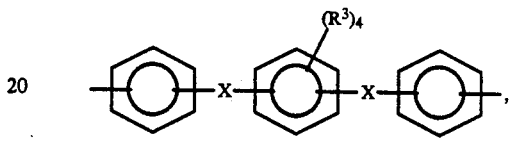

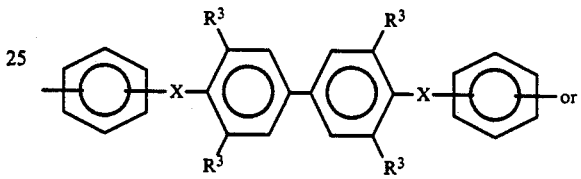

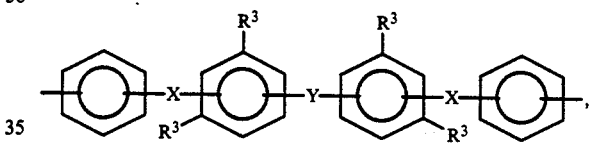

each $R^3$, respectively, being hydrogen, a halogen or an alkyl group of from 1 to 4 carbon atoms and each X and Y, respectively, being $$-O-, -SO_2-, -\underset{\underset{R^4}{|}}{\overset{\overset{R^4}{|}}{C}}-, -\underset{\underset{O}{\|}}{C}- \text{ or } -S-,$$

each $R^4$, respectively, being hydrogen, an alkyl group of from 1 to 4 carbon atoms or $-CF_3$, $R^2$ is

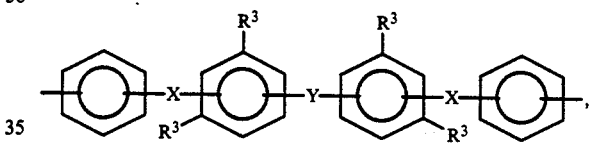

The preferred polyimide is an imidation product of a polyamic acid having the repeating unit represented by the formula (1).

It is preferable to use a polyimide adhesive comprising the polyimide and a bis-maleimide compound dissolved in a solvent or a polyimide adhesive comprising the polyamic acid and a bis-maleimide compound dissolved in a solvent. The latter is more preferable.

The polyamic acid having the repeating unit represented by the formula (1) is a reaction product of an aromatic diamine represented by the formula: $H_2N-R^1-NH_2$ or a derivative thereof and a tetracarboxylic acid represented by the formula: $R^2(COOH)_4$ or a derivative thereof.

Some examples of the aromatic diamine include 1,3-bis(3-aminophenoxy)benzene, 1,3-bis(4-aminophenoxy)benzene, 1,4-bis(4-aminophenoxy)benzene, 4,4'-bis(4-aminophenoxy)biphenyl, bis[4-(3-aminophenoxy)phenyl]sulfone, bis[4-(4-aminophenoxy)phenyl]sulfone, 2,2-bis[4-(4-aminophenoxy)phenyl]propane, 2,2-bis[4-(4-aminophenoxy)phenyl]hexafluoropropane, 2,2-bis[4-(3-aminophenoxy)phenyl]propane and 2,2-bis[4-(3-aminophenoxy)phenyl]hexafluoropropane. Diisocyanates thereof also may be used.

The aromatic diamine or derivative thereof, which provides the -$R^1$- group, affects largely the glass transition temperature of the product polyamic acid and polyimide.

In order to lower the temperature required for bonding by heating and pressing, it is important that the polyamic acid has a molecular design so that imidation of the polyamic acid provides a polyimide having a low glass transition temperature, and it is preferable to use an aromatic diamine or a derivative thereof containing three or more benzene rings, more preferably, further containing one or more m- bonds.

Monocyclic aromatic diamines, such as o-phenylenediamine, m-phenylenediamine, p-phenylenediamine, 2,4-diaminotoluene, 2,5-diaminotoluene, 2,4-diaminoxylene and diaminodurene, and bicyclic aromatic diamines, such as benzidine, 4,4'-diaminodiphenylmethane, 4,4'-diaminodiphenyl ether, 3,4'-diaminodiphenyl ether, 4,4'-diaminodiphenyl sulfone and 3,3'-diaminodiphenyl sulfone, may also be used.

Some examples of the tetracarboxylic acid containing =$R^2$= group include pyromellitic acid, 2,3,3',4'-tetracarboxydiphenyl, 3,3', 4,4'-tetracarboxydiphenyl, 3,3',4,4'-tetracarboxydiphenyl ether, 2,3,3',4'-tetracarboxydiphenyl ether, 3,3',4,4'-tetracarboxybenzophenone and 2,3,3',3'-tetracarboxybenzophenone. Derivatives of the tetracarboxylic acid also may be used, and some examples of derivatives include an ester, an anhydride and an acid chloride thereof.

These polyamic acids may be used individually or as a blend of two or more of them dissolved in a solvent, and those obtained by copolymerization may also be used. The use of a polyamic acid modified by blending or copolymerization is rather preferable for the purpose of adjusting the glass transition temperature of polyimides derived from polyamic acids at the time of drying.

The more preferable polyimide adhesive comprises both the polyamic acid and a bis-maleimide compound in a state dissolved in a solvent. While the polyimide adhesive is being dried by heating to form an adhesive layer on both the surfaces of a polyimide film, the polyamic acid in the polyimide adhesive is imidized by the heating. In preparation of such a polyimide adhesive, it is therefore important for the control of glass transition temperature of the polyimide resulting from the imidation of the polyamic acid to design the molecular structure of the polyamic acid in consideration of the temperature for thermosetting of the bis-maleimide compound and the temperature for bonding to a flexible printed-circuit board. In the case of a polyimide adhesive containing both a polyamic acid and a bis-maleimide compound, the glass transition temperature of the adhesive layer after drying and imidation of the polyamic acid is lower than that of an adhesive layer containing no bis-maleimide compound. However, if the glass transition temperature is nonetheless extremely higher than the temperature for thermosetting of the bis-maleimide compound used, the bis-maleimide compound will be crosslinked in the course of the imidation of the polyamic acid so as to make the bonding with a flexible printed-circuit board by heating and pressing difficult. Further, the higher the glass transition temperature, the higher the temperature required to bond to a flexible printed-circuit board by heating and pressing. In view of these points, it is desirable that the polyimide derived from the polyamic acid has a glass transition temperature of not higher than 260° C.

Among the polyamic acids having the repeating units represented by the formula (1), the preferred polyamic acid are those having the repeating units represented by the following formula (2)

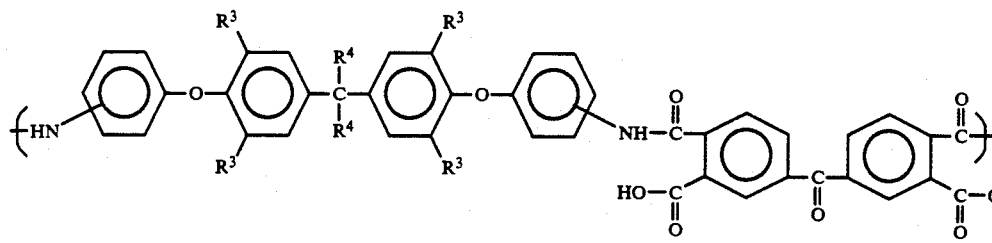

(2)

wherein
each $R^3$, respectively, is hydrogen, a halogen or an alkyl group of from 1 to 4 carbon atoms, and
each $R^4$, respectively, is hydrogen, an alkyl group of from 1 to 4 carbon atoms or —$CF_3$.

The preparation of the polyamic acid is carried out by reacting equimolar quantities of the above-described aromatic diamine or a reactive derivative thereof and the above-described tetracarboxylic acid or a reactive derivative thereof in a solvent, such as N-methylpyrrolidone (NMP), N,N-dimethylformamide (DMF), N,N-dimethylacetamide (DMAc), dimethylsulfoxide (DMSO), phenol, a halogenated phenol, 1,4-dioxane, γ-butyrolactone, tetrahydrofuran and diethylene glycol dimethyl ether, at a temperature ranging from 0° to 150° C. These solvents may be used individually or as a mixture of two or more of them. Selection of the solvents to be used is also important. It is undesirable to use a solvent the removal of which, at the time of drying of the applied polyimide adhesive, requires an extremely higher temperature than the temperature for thermosetting of the bis-maleimide compound, because the use of such a solvent causes crosslinking of the bis-maleimide compound prior to bonding by heating and pressing and makes adhesion to a flexible printed-circuit board difficult.

The bis-maleimide compound which may be used in the present invention is represented by the following formula:

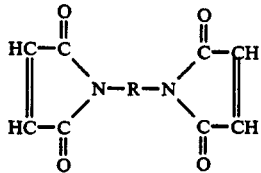

Typical examples of the bis-maleimide compound include N,N'-m-phenylene-bis-maleimide, N,N'-p-phenylene-bis-maleimide, N,N'-(oxy-di-p-phenylene)bis-maleimide, N,N'-(methylene-di-p-phenylene)bis-maleimide, N,N'-(sulfonyl-di-p-phenylene)bis-maleimide and 2,2-bis(maleimide-phenoxyphenyl)propane, but the bis-maleimide compounds which may be used in the present invention are not limited to these examples. The quantity of the bis-maleimide compound used is not particularly limited, but the preferred quantity is 10 to 100 parts by weight, more preferably 20 to 60 parts by weight, per 100 parts by weight of the polyamic acid used.

The coverlay film thus obtained, namely a polyimide film that has a surface treated to increase the adhering property and another surface not treated to increase the adhering property and is coated on each surface with an adhesive layer, and a flexible printed-circuit board that comprises a flexible base having a surface bearing a circuit are assembled to form a composite wherein the adhesive layer coating the surface treated to increase the adhering property is interposed between the polyimide film and the surface bearing the circuit.

The composite is then subjected to heat and pressure to bond the composite into a laminate structure. The bonding is generally carried out at a temperature not lower than the glass transition temperature of the polyimide or the mixture of a polyimide and a bis-maleimide compound in the adhesive layer and not lower than the temperature for thermosetting of the bis-maleimide compound. The pressure is not particularly limited, but it is preferably not lower than 10 kgf/cm$^2$, more preferably 20 to 40 kgf/cm$^2$. The time of the bonding by heating and pressing is not particularly limited so long as secure adhesion of the adhesive layer and, when a bis-maleimide compound is used, thermosetting of the bis-maleimide compound is attained. In an embodiment, preferable time for bonding by heating and pressing is 15 to 60 minutes.

The flexible printed-circuit board used in the present invention is not particularly limited so long as it comprises at least one flexible base which has at least one surface bearing a circuit. A typical example of the preferred flexible printed-circuit board is a flexible printed-circuit board having no adhesive layer or a flexible printed-circuit board having at least one adhesive layer therein. The flexible printed-circuit board having no adhesive layer may be produced by making at least one circuit on the copper foil-bearing surface of a copper foil/polyimide film laminate, namely a copper-clad polyimide film having no adhesive layer. The flexible printed-circuit board having at least one adhesive layer may be produced by making at least one circuit on the copper foil-bearing surface of a copper foil/adhesive/polyimide film laminate, namely a copper-clad polyimide film having an adhesive layer, or on both the copper foil-bearing surfaces of a copper foil/adhesive/polyimide film/adhesive/copper foil laminate, namely a double-sided copper-clad polyimide film. The copper-clad polyimide film having at least one adhesive layer may be produced by bonding a copper foil to at least one surface of a polyimide film through an adhesive, and the adhesive preferably has a glass transition temperature of not lower than 200° C. If the glass transition temperature of the adhesive in a flexible printed-circuit board is lower than 200° C., the circuit of the flexible printed-circuit board may get out of position by the heating and pressing at the time of bonding with a coverlay film and the flexible printed-circuit board may be deteriorated. In the present invention, bonding by heating and pressing is generally carried out at a temperature approximately 100° to 150° C. higher than the glass transition temperature of the acrylic or epoxy adhesives that have generally been used in the conventional three-layer flexible printed-circuit boards.

An example of the copper foil/polyimide film laminate, namely the copper-clad polyimide film having no adhesive layer, is MCF-5000I (Trade name for a copper-clad film produced by Hitachi Chemical Company, Ltd.). An example of the copper foil/adhesive/polyimide film laminate, namely the copper-clad polyimide film having an adhesive layer, is MCF-5010I (Trade name for a copper-clad film produced by Hitachi Chemical Company, Ltd. wherein the adhesive used has a glass transition temperature of not lower than 200° C.).

Prior to the bonding, it is desirable to subject the circuit of the flexible printed-circuit board to be used to a treatment for improving the adhering property, such as a browning treatment (cuprous oxide), a blackening treatment (cupric oxide) or a treatment with a coupling agent.

Finally the adhesive layer coating the polyimide film on the surface that is not treated to increase the adhering property or is subjected to a release treatment is removed off from the laminate obtained by bonding. The removal of the adhesive layer can be performed easily by peeling it from an end of the laminate with hands.

According to the present invention, coverlay films which do not curl and are excellent in heat resistance can be obtained. A combined use of such coverlay films and two-layer metal-clad films make it possible to produce heat resistant flexible printed circuit boards covered with coverlay.

EXAMPLES 1 TO 3 AND COMPARATIVE EXAMPLES 1 AND 2

Preparation Example 1

Into a 60-liter stainless reaction vessel equipped with a thermocouple, a stirrer, a nitrogen inlet and a condenser placed were 4.20 kg of 2,2-bis[4-(4-aminophenoxy)phenyl]propane and 42.5 kg of N,N-dimethylacetamide, and were then stirred to dissolve 2,2-bis[4-(4-aminophenoxy)phenyl]propane in N,N-dimethylacetamide, while dried nitrogen was made to flow through the reaction vessel. While the resulting solution was cooled to 20° C. or lower with a water jacket, polymerization was carried out by adding 3.30 kg of benzophenone tetracarboxylic dianhydride slowly into the solution, to obtain a viscous polyamic acid varnish.

For the purpose of facilitating the following application operation, the polyamic acid varnish was cooked at 80° C. until the rotating viscosity of the polyamic acid varnish reached about 200 poise. The polyamic acid varnish contained 7.5 kg (15% by weight) of a polyamic acid. A polyimide having a glass transition temperature of 245° C. was obtained by imidizing the polyamic acid.

The polyamic acid varnish was then cooled to 40° C., and 1.50 kg of N,N'-(methylene-di-p-phenylene)bis-maleimide, which correspond to 20 parts by weight of N,N'-(methylene-di-p-phenylene)bis-maleimide per 100 parts by weight of the polyamic acid used, was added and dissolved therein to obtain a polyimide adhesive.

EXAMPLE 1

A surface of a polyimide film of 25 μm thick (produced by Ube Industries, Ltd., trade name: UPILEX-S) was subjected to an oxygen plasma treatment (pressure: 0.1 torr, plasma power density: 26 W/cm$^2$, time: approximately 3 seconds), and the other surface of the polyimide film was kept untreated. The polyimide adhesive prepared in the Preparation Example 1 was applied to both the surfaces of the polyimide film, and was dried at 150° C. for 10 minutes and at 200° C. for 30 minutes, to dry the polyimide adhesive and imidize the polyamic acid therein. Each of the adhesive layers of the coverlay film thus obtained was 40 μm thick and contained 0.3% by weight of residual volatile matter.

A flexible printed-circuit board was produced from a two-layer copper-clad film (copper foil/polyimide film) (Trade name MCF-5000I, produced by Hitachi Chemical Company, Ltd.) by making the copper foil layer of the two-layer copper-clad film into a circuit of stripe lines (line width: 0.050–0.500 mm, thickness: 35 μm) and then subjecting the circuit surface to a browning treatment. The flexible printed-circuit board and the coverlay film were located together to form a composite wherein the circuit surface of the copper-clad film contacted the adhesive layer coating the plasma treated surface. The composite was tightened temporarily and was then pressed at 250° C. for 30 minutes under a pressure of 40 kgf/cm$^2$. Subsequently, the adhesive layer coating the untreated surface of the polyimide film of the coverlay film was peeled off, to obtain a flexible printed-circuit board covered with a coverlay. The peel strength between the adhesive layer and the untreated surface of the polyimide film was 0.3 kgf/cm.

The peel strength of the coverlay from the flexible printed-circuit board was 0.9 kgf/cm, and no abnormality was recognized after a solder-bath test conducted at 350° C. for three minutes.

EXAMPLE 2

A flexible printed-circuit board covered with a coverlay was produced in the same manner as in Example 1 with the exception that a three-layer copper-clad laminate (copper foil/adhesive having a glass transition temperature of 220° C./polyimide film) (Trade name MCF-5010I, produced by Hitachi Chemical Company, Ltd.) was used in place of the two-layer copper-clad laminate used in Example 1.

The peel strength between the adhesive layer and the untreated surface of the polyimide film was 0.3 kgf/cm.

The peel strength of the coverlay was 0.9 kgf/cm, and no abnormality was recognized after a solder-bath test conducted at 350° C. for three minutes.

EXAMPLE 3

A flexible printed-circuit board covered with a coverlay was produced in the same manner as in Example 1 with the exception that a polyimide film of 25 μm thick having a surface treated to improve the adhering property (Trade name UPILEX-SGA, produced by Ube Industries, Ltd.) was used and no further surface treatment was carried out.

The peel strength between the adhesive layer and the untreated surface of the polyimide film was 0.3 kgf/cm.

The peel strength of the coverlay was 0.8 kgf/cm, and no abnormality was recognized after a solder-bath test conducted at 350° C. for three minutes.

Comparative Example 1

A coverlay film was produced in the same manner as in Example 1 with the exception that a coverlay film was produced by forming an adhesive layer only on the plasma treated surface of a polyimide film. The obtained coverlay film curled severely so as to make it difficult to locate properly it and a flexible printed-circuit board together. A flexible printed-circuit board covered with a coverlay was produced in the same manner as in Example 1 with the exception that the thus obtained coverlay film was used, but, in the produced flexible printed-circuit board covered with a coverlay, the flexible printed-circuit board and the coverlay did not meet each other.

Comparative Example 2

A flexible printed-circuit board covered with a coverlay was produced in the same manner as in Example 1 with the exception that a polyimide film having an epoxy adhesive layer on only one surface (Trade name CUSV, produced by Nikkan Kogyo Co., Ltd.) was used as a coverlay film. Delamination of the coverlay occurred after a solder-bath test at 350° C.

What is claimed is:

1. A method of producing a flexible printed-circuit board covered with a coverlay comprising:
   (i) assembling
      (a) a flexible printed-circuit board that comprises a flexible base having a surface bearing a circuit; and
      (b) a polyimide film having a first surface treated to increase adherence and a second surface not treated to increase adherence, each of the first and second surfaces being coated with an adhesive layer by applying a polyimide adhesive to each of the first and second surfaces and drying the applied polyimide adhesive by heating, the polyimide adhesive comprising a compound selected from the group consisting of a polyimide and a polyimide precursor; to form a composite wherein the adhesive layer coating on the first surface treated to increase adherence is interposed between the polyimide film and the surface bearing the circuit;
   (ii) subjecting the composite to heat and pressure to bond the composite into a laminate structure; and
   (iii) peeling off from the laminate structure the adhesive layer coating on the second surface of the polyimide film which is not treated to increase adherence.

2. The method of claim 1, wherein the polyimide film has a linear thermal expansion coefficient of not larger than $2.5 \times 10^{-5} \text{deg}^{-1}$ at a temperature of 50° to 250° C.

3. The method of claim 2, wherein the flexible printed-circuit board is made from a copper-clad polyimide film not having an adhesive layer, the copper-clad polyimide film comprises a polyimide film which bears on one surface thereof a copper foil; the flexible base is the copper-clad polyimide film; and the circuit is formed on the copper foil.

4. The method of claim 2, wherein the flexible base of the flexible printed-circuit board is a polyimide film, and the circuit is a circuit formed by bonding a copper foil to at least one surface of the polyimide film through an adhesive having a glass transition temperature of not lower than 200° C. to form a copper-clad polyimide film, and forming the copper foil of the copper-clad polyimide film into a circuit.

5. The method of claim 3, wherein the treatment for increasing adhering property is a plasma treatment.

6. The method of claim 4, wherein the treatment for increasing adhering property is a plasma treatment.

7. The method of claim 2, wherein the surface of the polyimide film that is not treated to increase adherence is coated with a release agent.

8. The method of claim 1, wherein the polyimide adhesive comprises a polyamic acid dissolved in a solvent, the polyamic acid having a repeating unit represented by the following formula (1)

$$\left(\text{NH}-\text{R}^1-\text{NH}-\text{CO}-\underset{\text{HOOC}}{\overset{\text{R}^2}{\diagup}}\overset{}{\underset{\text{COOH}}{\diagdown}}\text{CO}-\right) \quad (1)$$

wherein R¹ is

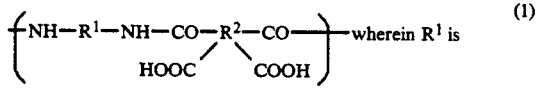

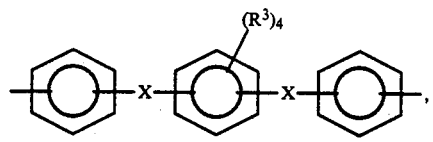

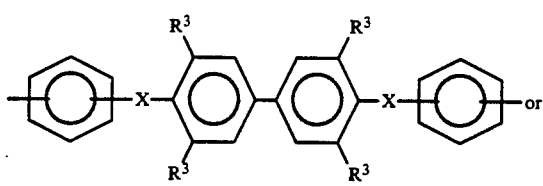

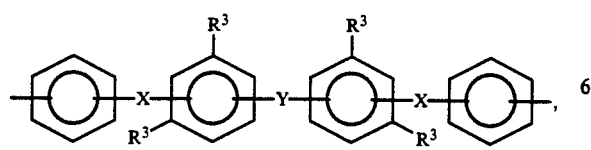

each R³, respectively, being hydrogen, a halogen or an alkyl group of from 1 to 4 carbon atoms and each X and Y, respectively, being

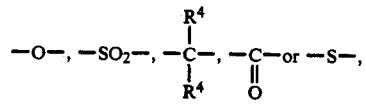

each R⁴, respectively, being hydrogen, an alkyl group of from 1 to 4 carbon atoms or $-CF_3$, R² is

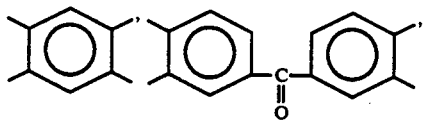

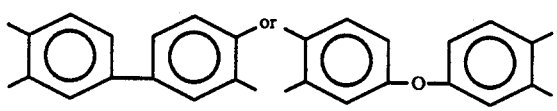

9. The method of claim 8, wherein the polyimide film has a liner thermal expansion coefficient of not larger than $2.5 \times 10^{-5} \text{deg}^{-1}$ at a temperature of 50° to 250° C.

10. The method of claim 9, wherein the treatment for increasing adherence is a plasma treatment.

11. The method of claim 9, wherein the polyimide adhesive includes 20 to 60 parts by weight of a bis-maleimide compound per 100 parts by weight of the polyamic acid.

12. The method of claim 11, wherein the bis-maleimide compound is selected from the group consisting of N,N'-m-phenylene-bis-maleimide, N,N'-p-phenylene-bis-maleimide, N,N'-(oxy-di-p-phenylene)bis-maleimide, N,N'-(methylene-di-p-phenylene)bis-maleimide, N,N'-(sulfonyl-di-p-phenylene)bis-maleimide and 2,2-bis(maleimidephenoxyphenyl)propane.

13. The method of claim 11, wherein the flexible printed-circuit board is made from a copper-clad polyimide film not having an adhesive layer, the copper-clad polyimide film comprises a polyimide film which bears on one surface thereof a copper foil; the flexible base is the copper-clad polyimide film; and the circuit is formed on the copper foil.

14. The method of claim 11, wherein the flexible base of the flexible printed-circuit board is a polyimide film, and the circuit is a circuit formed by bonding a copper foil to at least one surface of the polyimide film through an adhesive having a glass transition temperature of not lower than 200° C. to form a copper-clad polyimide film, and forming a circuit on the copper foil of the copper-clad polyimide film.

15. The method of claim 9, wherein the polyamic acid has a repeating unit represented by the following formula (2)

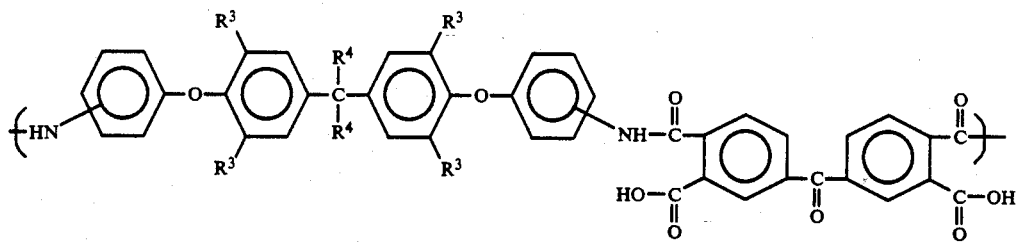

wherein
each $R^3$, respectively, is hydrogen, a halogen or an alkyl group of from 1 to 4 carbon atoms, and
each $R^4$, respectively, is hydrogen, an alkyl group of from 1 to 4 carbon atoms or —$CF_3$.

16. The method of claim 9, wherein the polyamic acid is a reaction product of an aromatic diamine selected from the group consisting of 1,3-bis(3-aminophenoxy)benzene, 1,3-bis(4-aminophenoxy)benzene, 1,4-bis(4-aminophenoxy)benzene, 4,4'-bis(4-aminophenoxy)biphenyl, bis[4-(3-aminophenoxy)phenyl]sulfone, bis[4-(4-aminophenoxy)phenyl]sulfone, 2,2-bis[4-(4-aminophenoxy)phenyl]propane, 2,2-bis[4-(4-aminophenoxy)phenyl]hexafluoropropane, 2,2-bis[4-(3-aminophenoxy)phenyl]propane, 2,2-bis[4-(3-aminophenoxy)phenyl]hexafluoropropane and a diisocyanate thereof, and a tetracarboxylic acid compound selected from the group consisting of pyromellitic acid, 2,3,3',4'-tetracarboxydiphenyl, 3,3',4,4'-tetracarboxydiphenyl, 2,3,3',4'-tetracarboxydiphenyl ether, 3,3',4,4'-tetracarboxydiphenyl ether, 2,3,3',4'-tetracarboxybenzophenone, 3,3',4,4'-tetracarboxybenzophenone, an ester thereof, an anhydride thereof and an acid chloride thereof.

17. The method of claim 9, wherein the solvent is selected from the group consisting of N-methylpyrrolidone, N,N-dimethylformamide, N,N-dimethylacetamide, dimethylsulfoxide, phenol, a halogenated phenol, 1,4-dioxane, γ-butyrolactone, tetrahydrofuran and diethylene glycol diethyl ether.

18. The method of claim 11, wherein the treatment for increasing adherence is a plasma treatment; the polyamic acid is a reaction product of 2,2-bis[4-(4-aminophenoxy)phenyl]propane and 3,3',4,4'-tetracarboxybenzophenone; the solvent is N,N-dimethylacetamide; the bis-maleimide compound is N,N'-(methylene-di-p-phenylene)bis-maleimide, and the flexible printed-circuit board is made from a copper-clad polyimide film having no adhesive layer, the copper-clad polyimide film comprises a polyimide film which bears on one surface thereof a copper foil; the flexible base is the copper-clad polyimide film; and the circuit is a circuit which is formed on the copper foil.

19. The method of claim 11, wherein the treatment for increasing adherence is a plasma treatment; the polyamic acid is a reaction product of 2,2-bis[bis[4-(4-aminophenoxy)phenyl]propane and 3,3',4,4'-tetracarboxybenzophenone; the solvent is N,N-dimethylacetamide; the bis-maleimide compound is N,N'-(methylene-di-p-phenylene)bis-maleimide; the flexible base of the flexible printed-circuit board is a polyimide film; the circuit is formed by bonding a copper foil to at least one surface of the polyimide film through an adhesive having a glass transition temperature of not lower than 200° C. to form a copper-clad polyimide film and forming a circuit on the copper foil.

20. The method of claim 2, wherein the bonding by heat and pressure is carried out at a pressure of 20 to 40 kgf/cm²; at a temperature of 100° to 150° C. higher than the glass transition temperature of the adhesive and for a period of time of 15 to 60 minutes.

21. The method of claim 20, wherein the treatment for increasing the adherence is a plasma treatment carried out with a gas selected from the group consisting of at least one or two of oxygen, nitrogen, helium, argon and $CF_4$; at a pressure of 0.08 to 0.15 torr, at a power density of 0.5 to 50 W/cm², and for a period of time of 10 seconds to 30 minutes.

22. The method of claim 21, wherein the polyimide adhesive comprises a polyamic acid dissolved in a solvent, the polyamic acid having a repeating unit represented by the following formula (1)

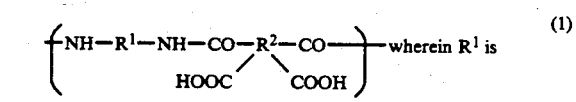

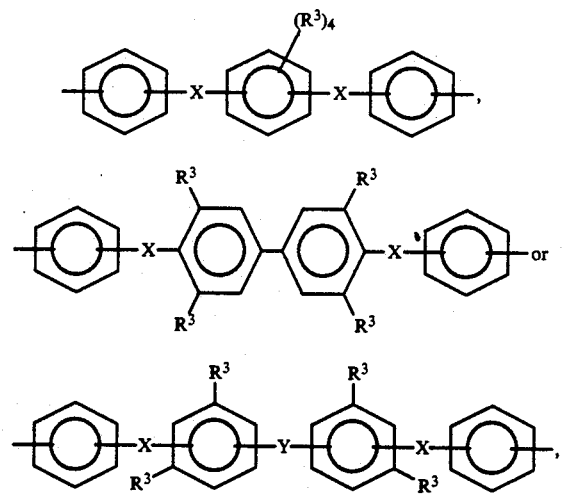

each $R^3$, respectively, being hydrogen, a halogen or an alkyl group of from 1 to 4 carbon atoms and each X and Y, respectively, being

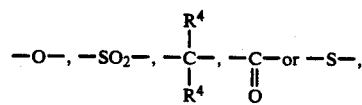

each $R^4$, respectively, being hydrogen, an alkyl group of from 1 to 4 carbon atoms or —$CF_3$, $R^2$ is

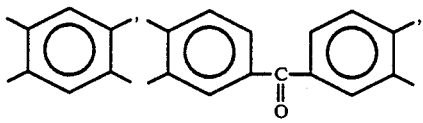

the polyimide adhesive including 20 to 60 parts by weight of a bis-maleimide compound per 100 parts by weight of the polyamic acid; the bis-maleimide compound being selected from the group consisting of N,N'-m-phenylene-bis-maleimide, N,N'-p-phenylene-bis-maleimide, N,N'-(oxy-di-p-phenylene)bis-maleimide, N,N'-(methylene-di-p-phenylene)bis-maleimide, N,N'-(sulfonyl-di-p-phenylene)bis-maleimide and 2,2-bis(maleimide-phenoxyphenyl)propane; and the solvent is selected from the group consisting of N-methylpyrrolidone, N,N-dimethylformamide, N,N-dimethylacetamide, dimethylsulfoxide, phenol, a halogenated phenol, 1,4-dioxane, γ-butyrolactone, tetrahydrofuran and diethylene glycol diethyl ether.

* * * * *